United States Patent [19]

Ogawa

[11] Patent Number: 4,773,045
[45] Date of Patent: Sep. 20, 1988

[54] SEMICONDUCTOR MEMORY DEVICE WITH SHIFT DURING WRITE CAPABILITY

[75] Inventor: Junji Ogawa, Tokyo, Japan

[73] Assignee: Fujitsu Limited, Kawasaki, Japan

[21] Appl. No.: 788,000

[22] Filed: Oct. 16, 1985

[30] Foreign Application Priority Data

Oct. 16, 1984 [JP] Japan .................. 59-216785

[51] Int. Cl.⁴ .................. G11C 19/00; G11C 19/28
[52] U.S. Cl. .................. 365/78; 365/219; 365/220
[58] Field of Search .................. 365/78, 219, 238, 220

[56] References Cited

U.S. PATENT DOCUMENTS

| | | | |
|---|---|---|---|
| 4,151,609 | 4/1979 | Moss | 365/78 X |
| 4,281,401 | 7/1981 | Redwine et al. | |
| 4,321,695 | 3/1982 | Redwine et al. | 365/154 |
| 4,330,852 | 5/1982 | Redwine | 365/205 X |
| 4,347,587 | 8/1982 | Rao | 365/189 |
| 4,616,343 | 10/1986 | Ogawa | 365/203 |

FOREIGN PATENT DOCUMENTS

WO82/02615 8/1982 European Pat. Off.
56-098785 8/1981 Japan .

OTHER PUBLICATIONS

Patent Abstracts of Japan, vol. 1, No. 50, May 16, 1977, p. 3343, JP-A-51 147 225.

Primary Examiner—Stuart N. Hecker
Assistant Examiner—Alyssa H. Bowler
Attorney, Agent, or Firm—Staas & Halsey

[57] ABSTRACT

A semiconductor memory device including a RAM portion and a shift register for enabling parallel transfer of a one word line amount of data of the RAM portion between the RAM portion and the shift register. The shift register is divided into a plurality of shift register portions with serial input data being distributed alternately between the shift register portions by the operation of a multiplexer and serial output data being obtained by picking up data alternately from the shift register portions by the operation of another multiplexer. A transfer gate portion is inserted between the RAM portion and the shift register for carrying out parallel transfer, the transfer gate portion includes a plurality of groups of transfer gates for enabling selective connections of input and output terminals of each of the stages of the shift register portions with either of the adjacent odd numbered bit line and even numbered bit line of the RAM portion. The plurality of transfer gate groups are switched in correspondence with shift clock signals.

2 Claims, 17 Drawing Sheets

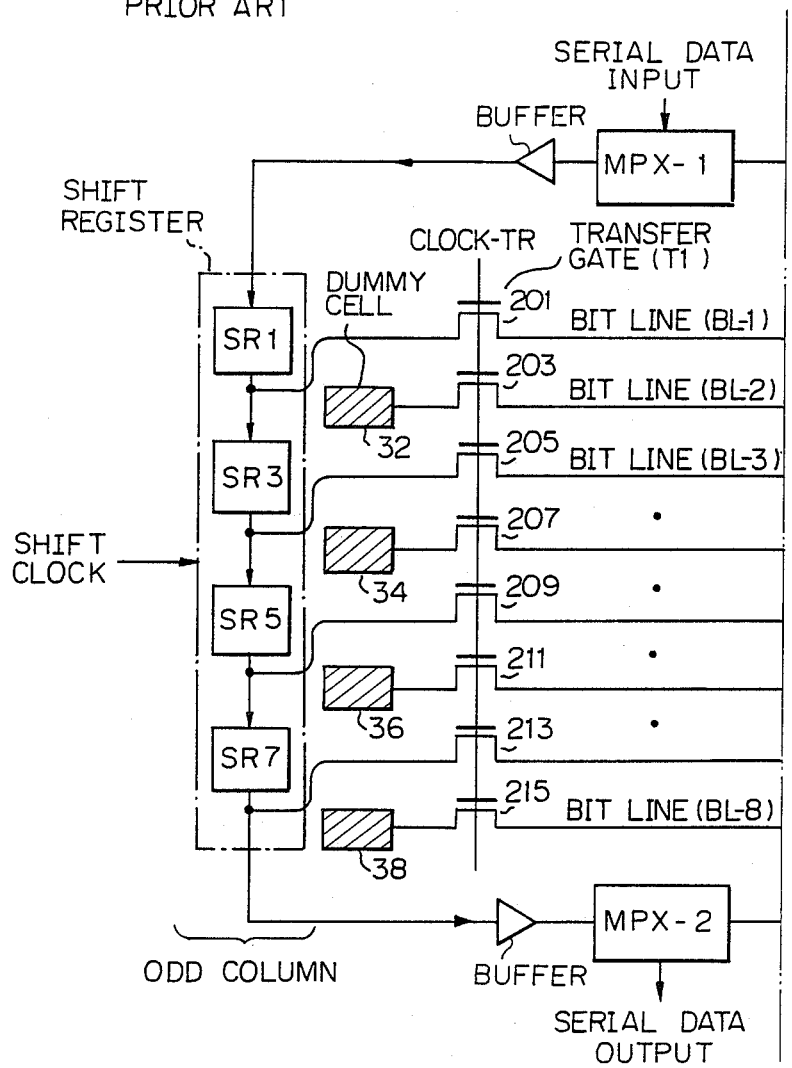

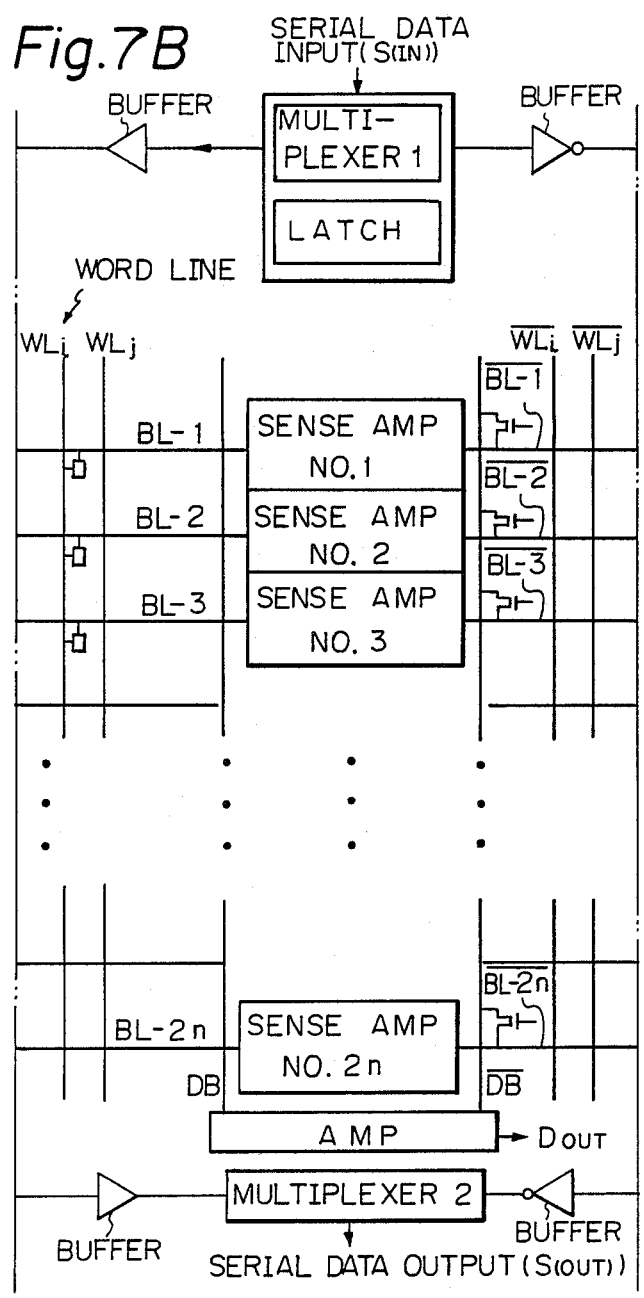

| Fig.10A | Fig.10B |

SEMICONDUCTOR MEMORY DEVICE WITH SHIFT DURING WRITE CAPABILITY

BACKGROUND OF THE INVENTION

1. Field of the Invention

The present invention relates to a semiconductor memory device having a built-in high-speed read/write shift register of a capacity corresponding to a group of memory cells on a word line and, more particularly, to a device directed to enabling one-bit shift in write transfer operation and driving a divided shift register.

2. Description of the Related Art

In the related art, there are known semiconductor memory devices which have a random access memory (RAM) and a shift register that can parallel-transfer data for a group of memory cells on a word line, thus enabling high-speed read/write operations. The semiconductor memory devices are utilized advantageously for image processing and the like, e.g., for use as video RAM's (VRAM's).

In one prior art VRAM, stages of a shift register are arranged in two columns; one for odd numbered bit lines and one for even numbered bit lines. An input side multiplexer allots serial data input S(in) alternately to the odd column and even column bit by bit. An output side multiplexer combines the odd column outputs and the even column outputs to form a serial data output. Internal clocks, equivalent to one cycle of a shift clock, are used. Thus, two cycles of a shift clock are needed for a one-bit shift in the two columns. On the other hand, changes in the output data after combination by the output multiplexer correspond to one cycle of the shift clock.

Thus, the rate of data transfer between the odd column and the even column is one-half that of the external input data and the external output data. This means a low-speed shift register is appropriate. Alternatively, if a normal speed shift register is used, it is possible to double the bit rate of the external input/output data and, thus, to achieve high-speed RAM write/read operations.

In the odd and even shift register columns, since two cylces of a shift clock are used for a bit shift, if a parallel data write-in operation is performed on a RAM for each cycle of the shift clock, then, while a prior stage of data ($Q_{N-1}$) is in a master stage, the output ($Q_N$) of the slave stage will be transferred to the RAM even if the output is the same as before or if the slave stage is in the process of changing and the output is still not settled.

It has been proposed to parallel transfer data to the RAM after the completion of a shift operation. In this case, there is the problem in that the odd column can only be connected to odd numbered bit lines, and the even column can only be connected to even numbered bit lines. Due to this, a two-bit shift can be executed, but not a one-bit shift. If parallel data transfer were performed per each shift clock, e.g., if word line selection were performed in the order n-th, (n+1)-th, (n+2)-th, and so on, the display screen of the apparatus incorporating the VRAM would show the same pattern of horizontal lines shifted by one bit. This type of processing may sometimes be required for image processing, but division of a shift register into odd numbered stages and even numbered stages would, again, limit such processing to two-bit units.

SUMMARY OF THE INVENTION

It is an object of the present invention to provide an improved semiconductor memory device with a high-speed read/write shift register, having a capacity corresponding to a memory cell group connected to one word line, which enables one-bit-shift writing for a plurality of shift register columns.

According to the present invention, there is provided a semiconductor memory device including: a RAM portion and a shift register for enabling parallel transfer of a one word line amount of data of the RAM portion between the RAM portion and the shift register. The shift register is divided into a plurality of shift register portions, serial input data being distributed alternately between the shift register portions by the operation of a multiplexer, and serial output data being obtained by picking up data alternately from the shift register portions by the operation of another multiplexer. A transfer gate portion is inserted between the RAM portion and the shift register for carrying out parallel transfers. The transfer gate portion includes a plurality of groups of transfer gates for enabling selective connections of input and output terminals of each stage of the shift register portions with either of the adjacent odd numbered bit line and even numbered bit line of the RAM portion. The plurality of transfer gate groups are switched in correspondence with shift clock signals.

In parallel data transfer from the shift register to the RAM, when a slave clock occurs, each stage of the slave output is post-shift data, so the output is written into the RAM as it is. When a master clock occurs, each stage of the slave output is pre-shift data, so the transfer gate is operated and the output is written onto the following bit line. This enables one-bit shifts. Also, the odd and even columns of the shift register can be coupled with either odd or even numbered bit lines.

DESCRIPTION OF THE PREFERRED EMBODIMENTS

Figure 1A:
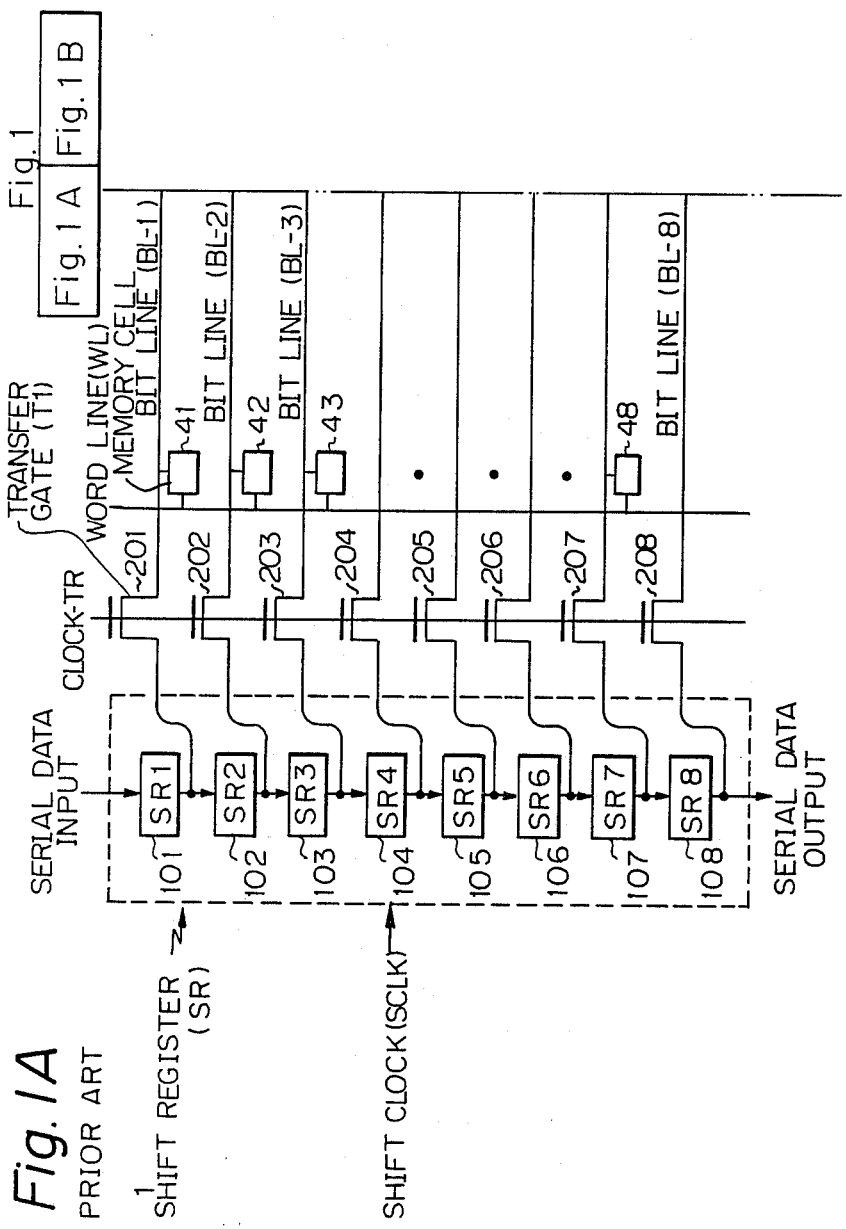
FIG. 1, including 1A and 1B, is a schematic block diagram of a prior art VRAM.
Figure 1B:
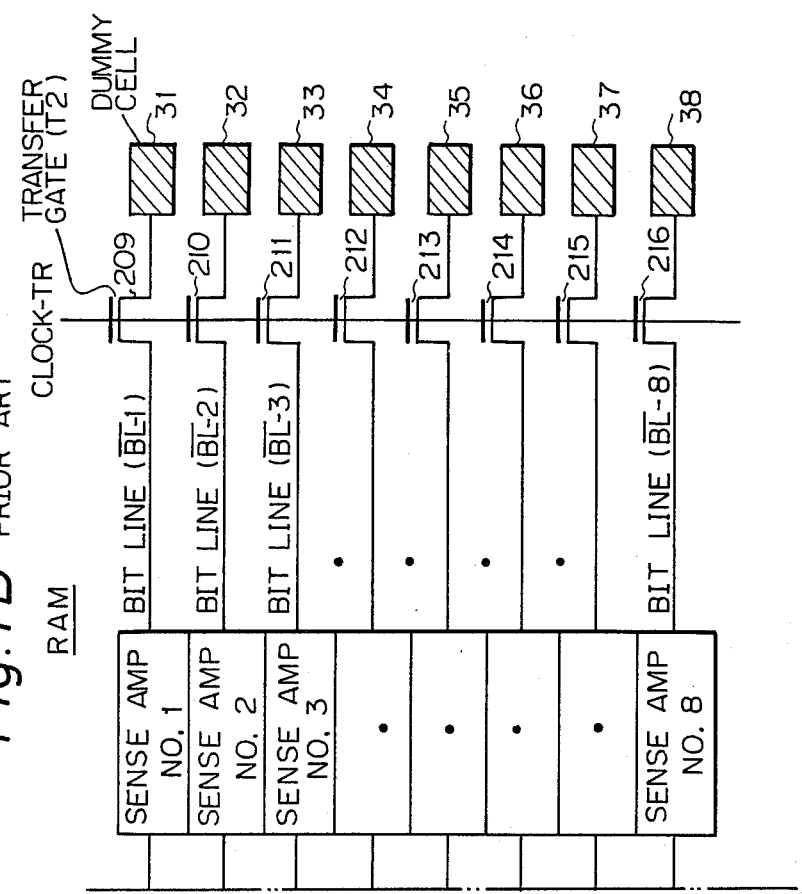

Before entering into the description of the preferred embodiments, examples of prior art VRAM devices will be described. FIG. 1 is a schematic view of an example of a prior art VRAM. In the Figure, 1 is a shift register and 101 to 108 are stages (bits) of the same. The RAM, a dynamic RAM in this example, has eight pairs of bit lines $\overline{BL-1}$, BL-1 to BL-8, $\overline{BL-8}$, so there are eight memory cells on a word line (in actual practice, more memory cells are generally provided). Therefore, eight stages are used for the shift register. The RAM has sense amplifier Nos. 1 to No. 8 arranged in the center. The pairs of bit lines BL-1, $\overline{BL-1}$ to BL-8, $\overline{BL-8}$ are connected thereto from the two ends. A plurality of word lines are arranged to intersect with these bit lines. Memory cells 41 to 48 are connected to the bit lines and word lines. A first group of transfer gates (T1) 201 to 208 are connected to the shift register 1 and the sense amplifier Nos. 1 to No. 8, and a second group of transfer gates (T2) 209 to 216 are connected to the sense amplifier Nos. 1 to No. 8 and dummy cells 31 to 38. The dummy cells are used for write transfer of the RAM. The transfer gates 201 to 216 receive parallel transfer clocks with the shift register 1 and RAM.

Figure 2:
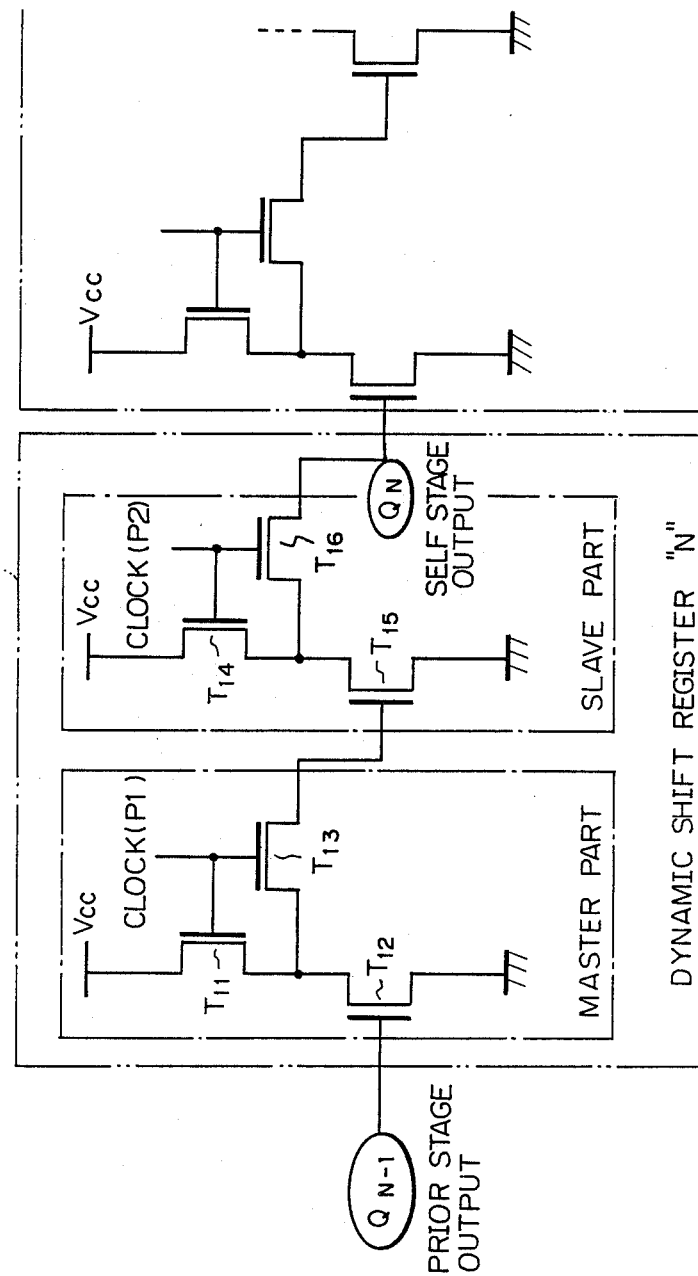
FIG. 2 is a circuit diagram of a shift register stage having a master and slave portions.
Figure 3:
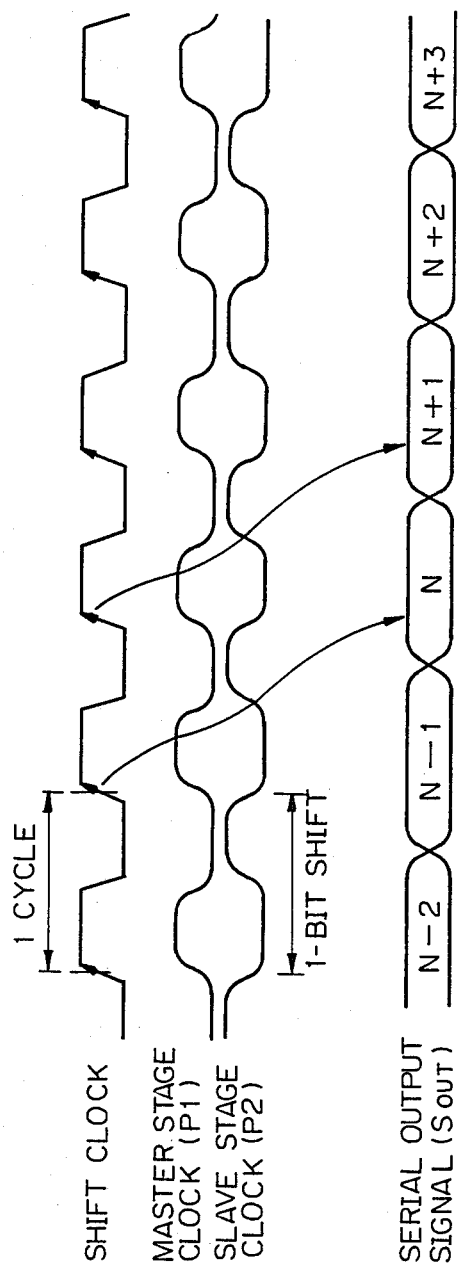
FIG. 3 shows waveforms of the shift operation of the VRAM of FIG. 2.

An example of a stage of the shift register 1 is provided in FIG. 2, showing a well-known dynamic shift register. The figure shows the shift register having a master-slave constitution an inherent feature of registers as well. In FIG. 2, prior stage output $Q_{N-1}$ is received first in a master part composed of transistors T11 to T13. Next, the content of the master part is transferred to into a slave part composed of transistors T14 to T16 to produce its own output $Q_N$. An operative clock P1 of the master part and an operative clock P2 of the slave part have opposite phases, as shown in FIG. 3. These are internally created to correspond to the first half and second half of a cycle of an external shift clock. Accordingly, when an external clock is provided, the clocks P1 and P2 are internally created for fetching prior stage data into the master part and transferring the data to the slave part. Each time an external clock (SCLK) is input, a one-bit shift is executed. At the bottom of FIG. 3 is shown the serial output of the shift register.

A high-speed write operation of a memory RAM is carried out as follows. Write data is sent serially bit by bit. Input data SIN is written bit by bit into a first stage SR1 of the shift register 1 in synchronization with a shift clock SCLK and consecutively transferred to the following stages SR2, SR3, . . . . In this example, when eight bits are written and transferred, each stage SR1 to SR8 of the shift register is filled, whereupon the transfer gates T1 and T2 are opened to carry out the write-in operation. That is, the bit lines BL-1, BL-2, . . . are connected to the output terminals of the stages SR1, SR2, . . . of the shift register, so when the transfer gates T1 and T2 are opened, a high-low comparison is made of the potential of each output terminal of the shift register and the potential of the dummy cells 31 to 38. The potential difference is enhanced by the sense amplifiers No. 1 to No. 8, making either of bit lines BL1 and $\overline{BL1}$, BL2 and $\overline{BL2}$, . . . an H (high) level and the other an L (low) level. In this stage, when a word line WL is selected (either on the BL side or $\overline{BL}$ side), all the memory cells associated with that word line are simultaneously written with the H or L level of the corresponding bit lines. In general, RAM's are written into bit by bit (i.e., each memory cell). The present system improves the speed by the number of memory cells on the word line, in this case, eight-fold.

The memory cells on a word line often correspond to the horizontal picture elements of the display of the apparatus using the VRAM. In this case, the number of memory cells is equal to the number of picture elements N (for instance N=512). The number of stages of the shift register is also equal to N. When N bits of input data SIN are introduced into the shift register, they are simultaneously written into the RAM as explained above. When the following N bits are introduced into the shift register, they are again simultaneously written into the RAM. This is repeated by a number of times corresponding to the number of longitudinal picture elements M, for instance, M=512 to complete the writing of one screen's worth of data. The number of word lines of the RAM is equal to M.

The read-out of the RAM is carried out as follows. First, all the bit lines BL-1, $\overline{BL-1}$, BL-2, . . . of the RAM are precharged. A word line WL is selected, whereupon the potential of the bit lines is changed by the stored data of the memory cells associated with the word line. The difference between the potentials of these bit lines and the potentials of the bits lines connected with dummy cells (not shown) are enhanced by the sense amplifiers. The thus defined H and L levels of the bit lines (BL-1, BL-2, . . . ) are input into the stages of the shift register by the opening of the transfer gate (T1). This data is fetched out in a bit serial mode as the output data SOUT by the shift clock SCLK. The output data SOUT becomes a video signal for a horizontal scanning line on the display.

Note that a picture element on a display is expressed not by one bit, but by a plurality of bits. In this case, as shown in FIG. 1, a plurality of memory units are arranged in parallel. The shift register, except during the parallel transfer (writing into a RAM and read-in therefrom), receives a serial data input signal SIN from an input terminal along with a shift clock SCLK and outputs the signal from an output terminal as SOUT.

In the device of FIG. 1, the data input and transfer to the shift register 1 are carried out bit by bit. The same is true of the external serial input/output data and data transfer rate. To speed up the writing and reading of the RAM, the shift register 1 must be operated at a faster speed. This is not, however, very simple.

Figure 4B:
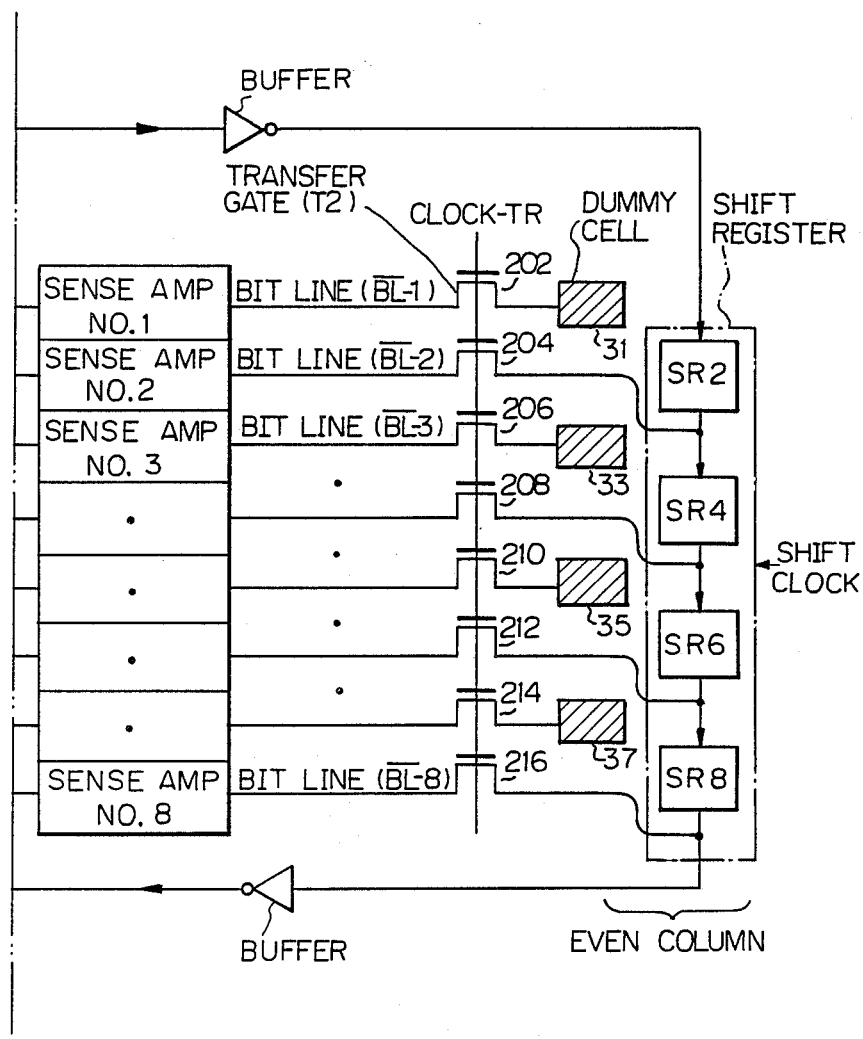
FIG. 4, including 4A and 4B, is a schematic block diagram of a prior art dynamic RAM in a normal mode.

One proposal arranges the stages of the shift register in a plurality of columns. FIG. 4 shows a prior art VRAM having two shift register columns one for odd numbered bit lines and one for even numbered bit lines. In the figure, SR1, SR3, SR5, SR7 are odd numbered shift register stages, and SR2, SR4, SR6, and SR8 are even numbered shift register stages. MPX1 is an input side multiplexer, which allots serial data input S(in) alternately to the odd column and seven column bit by bit. MPX2 is an output side multiplexer, which combines the odd column output and even column output to form serial data output S(OUT).

Figure 5:
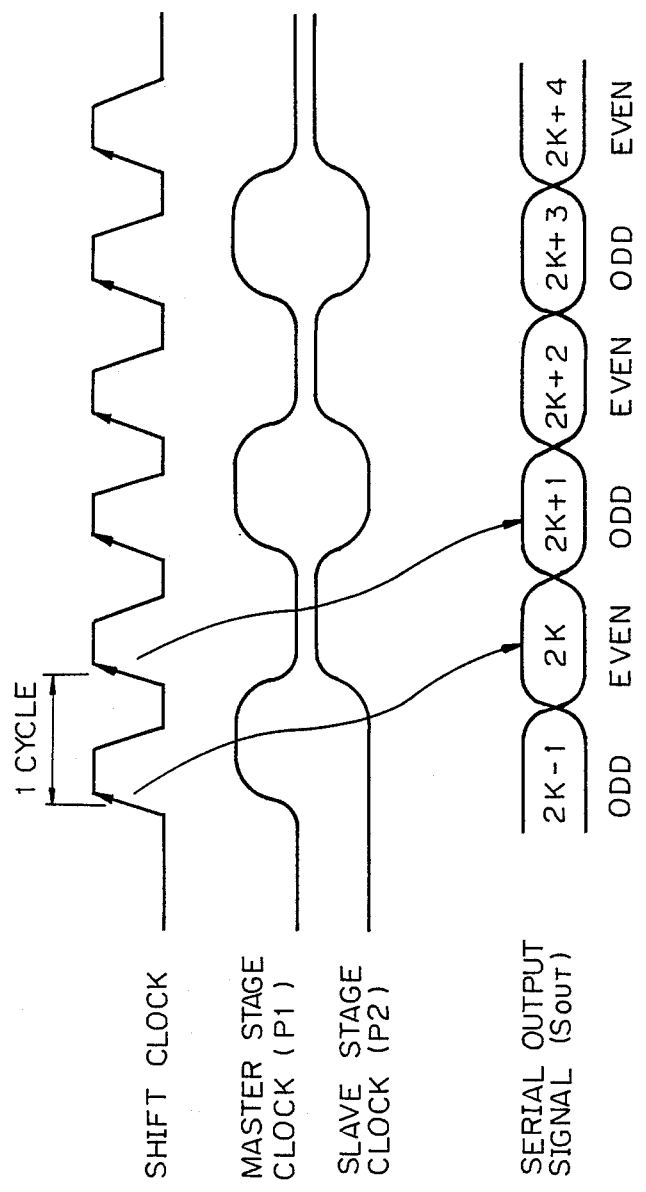
FIG. 5 shows waveforms of the shift operation of the VRAM of FIG. 4.

FIG. 5 is an operative waveform diagram of FIG. 4. In the figure, internal clocks P1 and P2 are, respectively, synchronized to one cycle of the shift clock SCLK. Thus, two cycles of the shift clock SCLK are necessary for a one-bit shift in the two columns. A change in output data S(OUT) after combination by the multiplexer 2, however, corresponds to one cycle of the shift clock SCLK.

As mentioned earlier, therefore, the rate of data transfer in the odd column and even column is one-half that of the external input data S(in) and the external output data S(OUT). This, again, means a low speed shift register will do or, if a normal speed shift register is used, it is possible to double the bit rate of the external input-/output data.

In the odd and even shift register columns, as shown in FIG. 4, two cycles of a shift clock SCLK (i.e., two clocks) are used for a bit shift, so if a parallel data write-in operation is performed on a RAM for each cycle of the shift clock SCLK, then, while a prior stage of data $Q_{N-1}$ is in a master stage, as shown in FIG. 2, the output $Q_N$ of the slave stage will be transferred to the RAM even if the output is the same as before or if the slave stage is in the process of changing and the output is still not settled.

Figure 6:
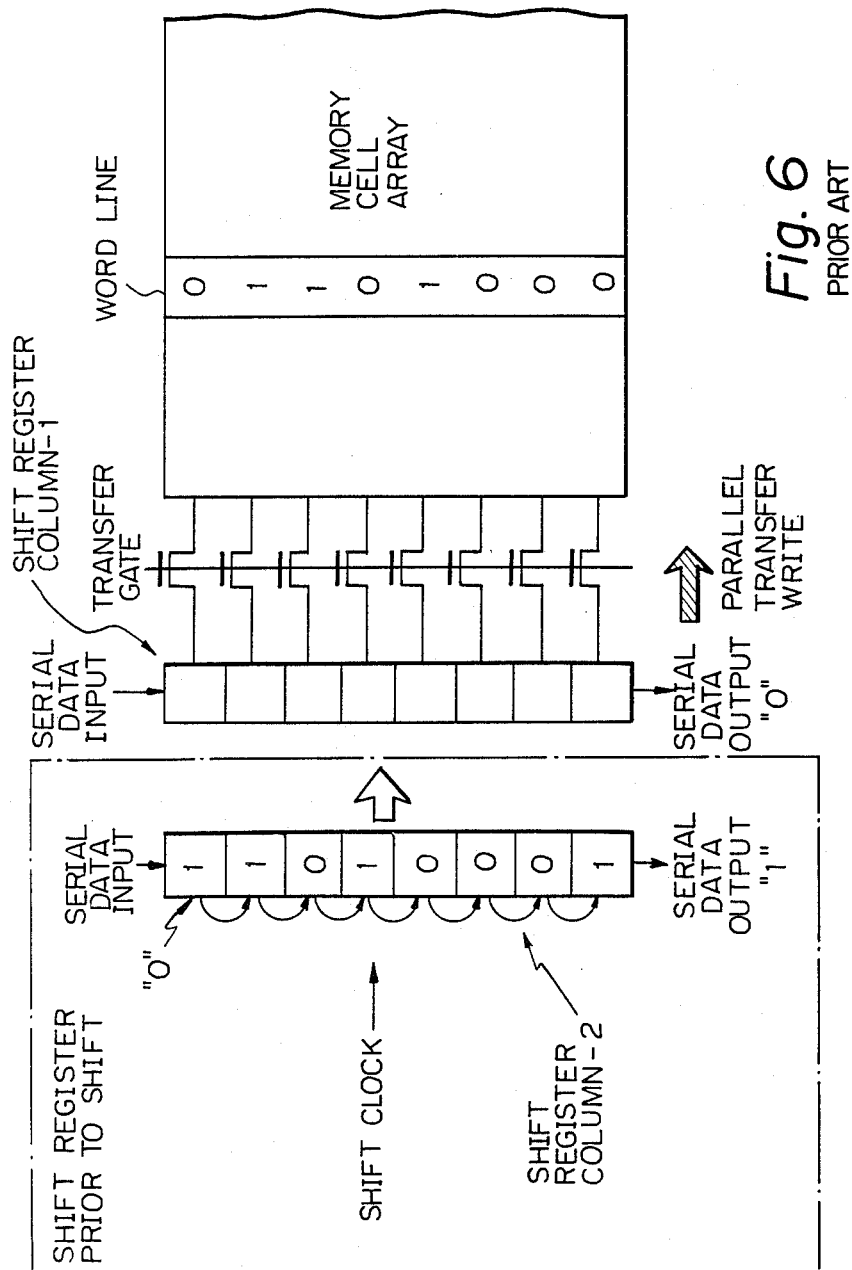
FIG. 6 is a view explaining a bad shift in the VRAM in FIG. 4.

FIG. 6 is a view explaining a bad shift in the VRAM of FIG. 4 in FIG. 6, "0" is input into the shift register column 2 having the serial data 11010001. When the shift by the slave stage according to clock P2 is finished, the content of data in the shift register column 1 is 01101000. This is parallel transferred to the group of memory cells on the selected word line WL in the memory cell array. If, however, the shift register is divided into odd and even columns as in FIG. 4 and transfers are performed at a ½ bit rate, the first clock of the shift clock SCLK is the P1 stage of the master clock on the odd column shift registers and the even column. If a parallel transfer is executed in this state, the old or undecided data in the odd column and even column prior to the shift completion will be transferred to the memory side. If it is intended to carry out parallel transfer of data to the RAM after completion of the shift operation, as is apparent from the constitution of FIG. 4, the odd column can only be connected to odd numbered bit lines BL1, BL3, and so on, and the even column can only be connected to even numbered bit lines BL2, BL4, and so on. Thus, while a two-bit shift can be executed, a one-bit shift cannot. If parallel data transfer were performed per each cycle of the shift clock SCLK, e.g., if word line selection were performed in the order n-th, (n+1)-th, (n+2)-th, and so on, the display screen of the apparatus incorporating the VRAM would show the same pattern of horizontal lines shifted by one bit. As mentioned before, this type of processing may sometimes be required for image processing, but division of a shift register into odd numbered stages and even numbered stages would limit such processing to two bit units.

Figure 7A:
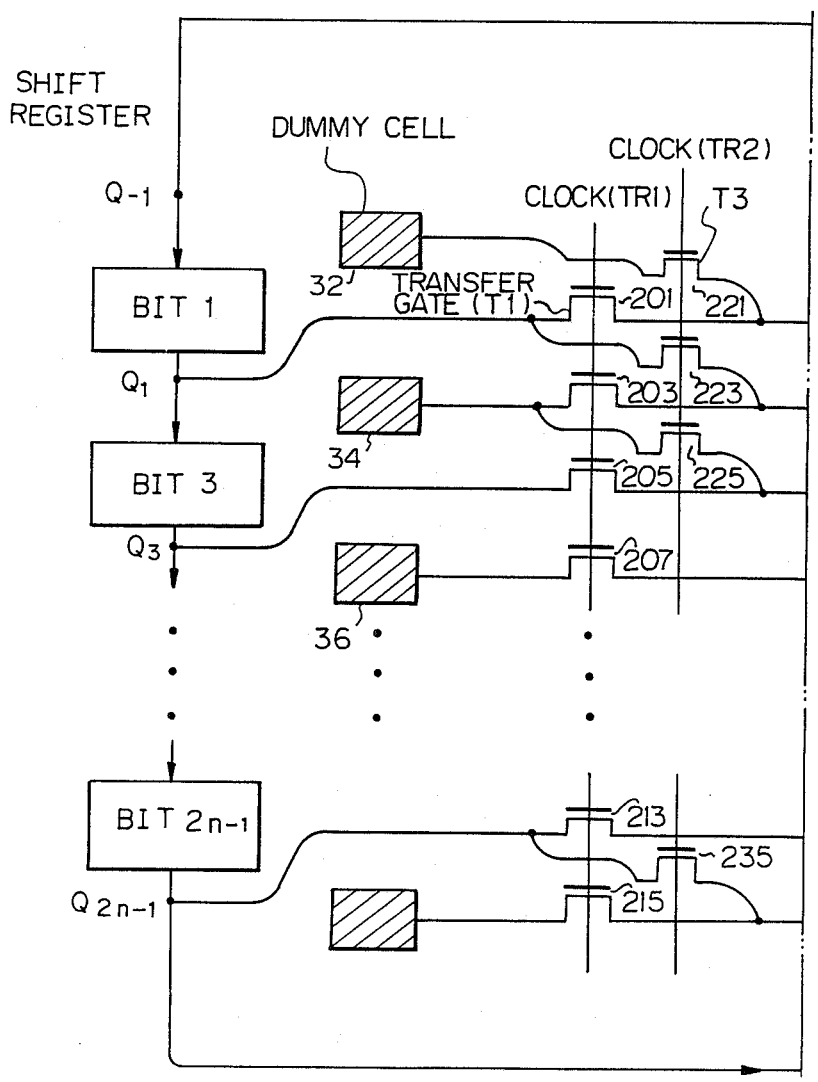
FIG. 7, including 7A–7C, is a diagram of a preferred embodiment of the present invention.
Figure 7C:
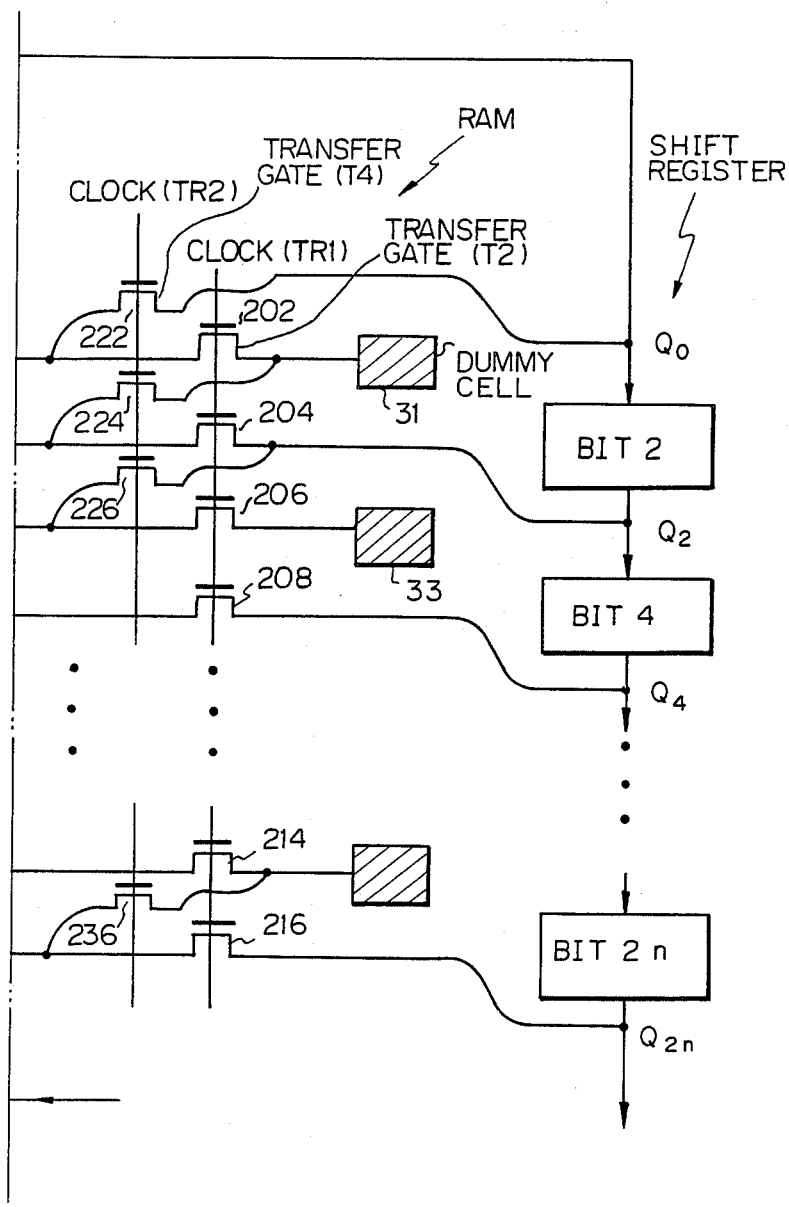

A semiconductor memory device according to an embodiment of the present invention is shown in FIG. 7. In FIG. 7, transfer gates T3 221 to 235 and T2 222 to 236 are provided. The odd column of shift register stage No. 1 to No. 7 and the even column of shift register stage No. 2 to No. 8 can be connected to the odd numbered bit lines (BL1, BL3, BL5, and BL7) and the even numbered bit lines (BL2, BL4, BL6, and BL8). Dummy cells are also connected to the odd and even numbered bit lines. The selection of transfer gates T1 to T4 is carried out by the exclusive transfer clocks TR1 and TR2. This is, if the clock TR2 is the L level and the clock TR1 is the H level, gates T1 and T2 turn on, just as in FIG. 4 (normal mode). If the clock TR2 is the H level, and the clock TR1 is the L level, the gates T3 and T4 turn on. Then, contrary to FIG. 4, the odd numbered bit lines are connected to the even column of shift register stages No. 2, No. 4, No. 6, and No. 8 and the even numbered bit lines are connected to the odd column of shift register stages No. 1, No. 3, No. 5, and No. 7 (inversion mode).

This inversion mode enables a one-bit shift. That is, in the inversion mode the coupling of the RAM and the shift register stages is inverted from odd to even or vice versa. For instance, the connection of the shift register stage No. 1 and bit line BL-1, shift register stage No. 2 and bit line BL-2, shift register stage No. 3 and bit line BL-3, and so on changes to connection of the shift register stage No. 1 and bit line $\overline{BL\text{-}2}$, shift register stage No. 2 and bit line $\overline{BL\text{-}3}$, shift register stage No. 3 and bit line BL-4, and so on. Therefore, after an intermediate shift by a master stage clock (P1 in FIG. 3), if the device enters into a RAM parallel transfer write mode, the write operation is carried out in the form of $\underline{BL\text{-}2}=Q_1$, $\overline{BL\text{-}3}=Q_2$, BL-4=$Q_3$, and so on (where $\overline{BL\text{-}1}=Q_0$). This operation is the same as the parallel write after a one-bit shift in FIG. 1.

In the normal mode, after the data shift of $Q_{-1} \rightarrow Q_1$, $Q_0 \rightarrow Q_2$, $Q_1 \rightarrow Q_3$, ... has been finished, a write operation of $Q_{-1} \rightarrow$ bit line BL-1, $Q_0 \rightarrow$ bit line BL-2, $Q_1 \rightarrow$ bit line BL-3, and so on is carried out and a one-bit shift is again carried out. Thus, selection of transfer clocks TR1 and TR2 corresponding to master clocks P1 and P2 enables a one-bit shift in the RAM and prevents writing of undecided data into the RAM.

Incidentally, in FIG. 7, the odd column of shift register stages No. 1, No. 3, No. 5, and No. 7 and the even column of shift register stages No. 2, No. 4, No. 6, and No. 8 were arranged to the left and the right of the cell array, respectively, but, in practice, they may be arranged either to the left or to the right. When the transfer gates T1 to T4 are closed, the shift register and the RAM operate independently, so the shift register can be utilized to shift serial data input S-IN and serial data output S-OUT. A read/write operation of a RAM when in a state separated from a shift register is generally carried out in one-bit units, as is well known, through data buses DB and $\overline{DB}$ arranged on the two sides of the group of sense amplifiers No. 1 to No. 8.

The above description was made with reference to a shift register divided into two columns, but it is apparent that the shift register can be divided into four columns, eight columns, and the like for operation at faster speeds.

Figures 10, 10A:
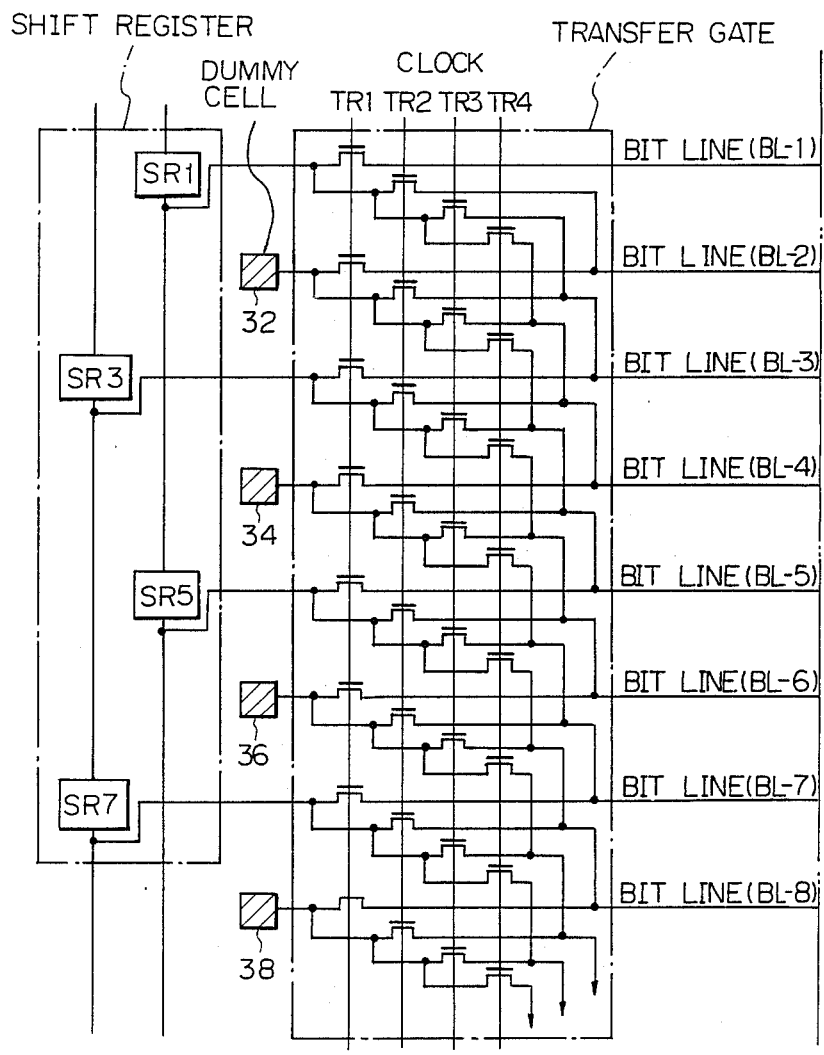
FIG. 10, including 10A and 10B, is a diagram of another alternative embodiment of the present invention.
Figure 10B:
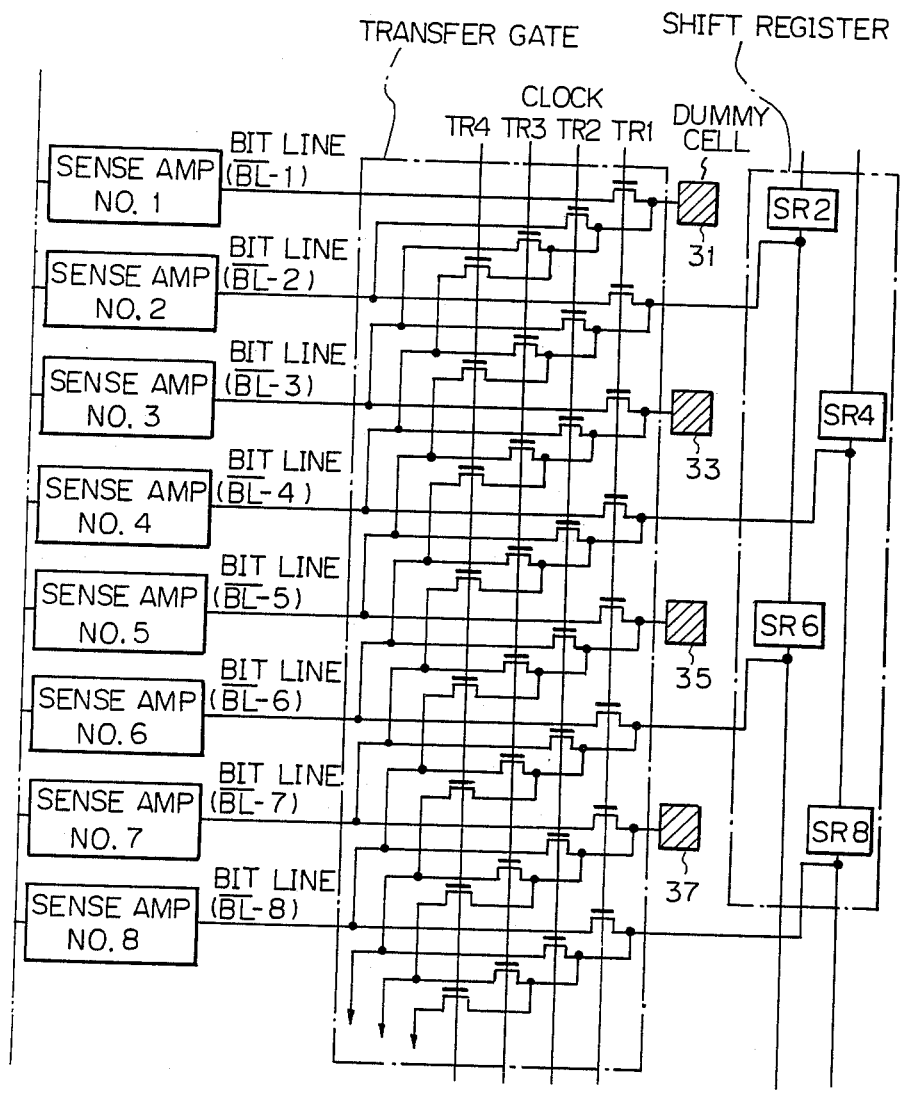

FIG. 10 shows an embodiment where the shift register is divided into four columns. Compared with FIG. 7, a multiplexer portion for the serial input S-IN and serial output S-OUT is omitted.

Figure 8A:
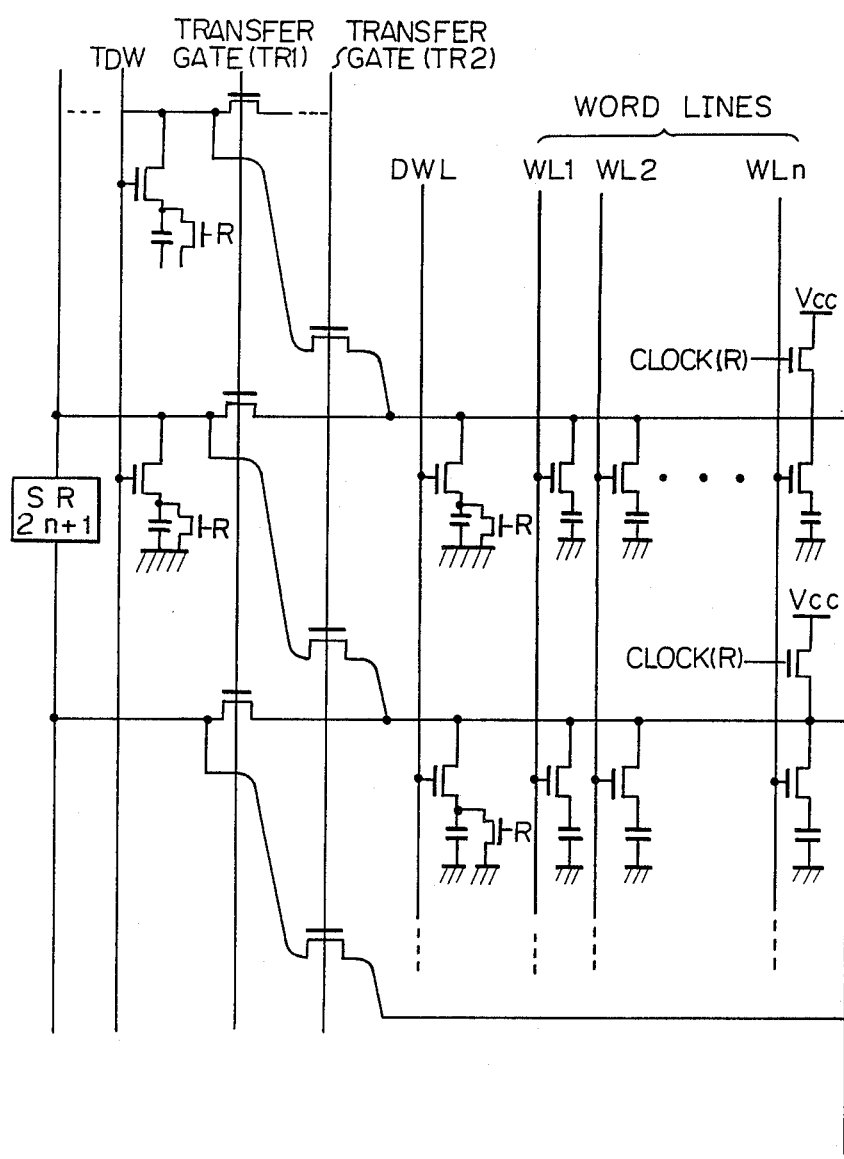
FIG. 8, including 8A–8C, is a diagram of an alternative embodiment of the present invention.
Figure 8B:
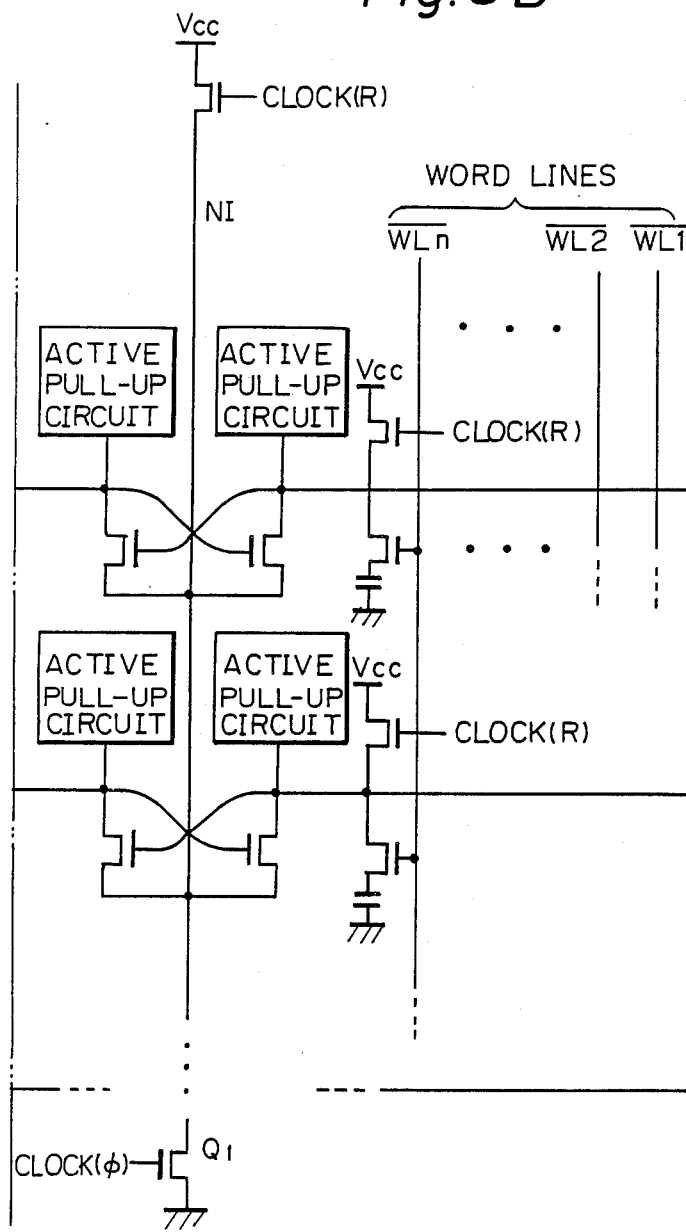
Figure 8C:
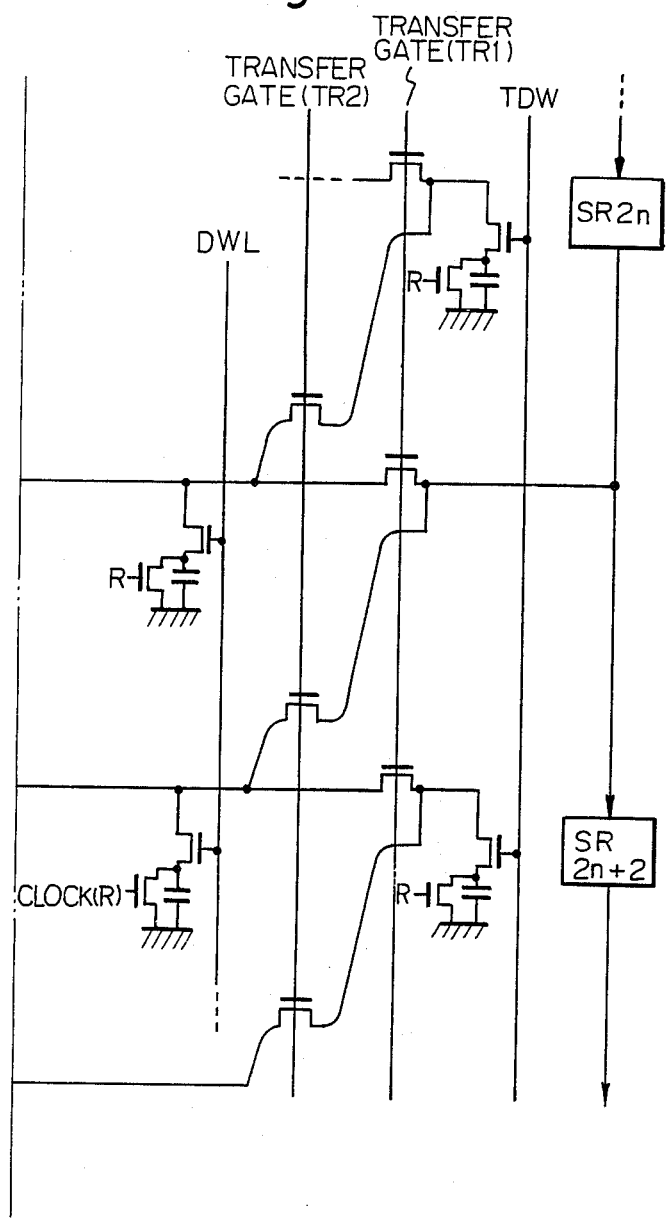

FIG. 8 is a view of an alternative embodiment of the present invention. With regards to the bit lines WLn and $\overline{WLn}$, a pair of active pull-up circuits are connected to the sense amplifier No. n. with respect to other points, the operations of the shift register and transfer gates are the same as in FIG. 7.

Figure 9:
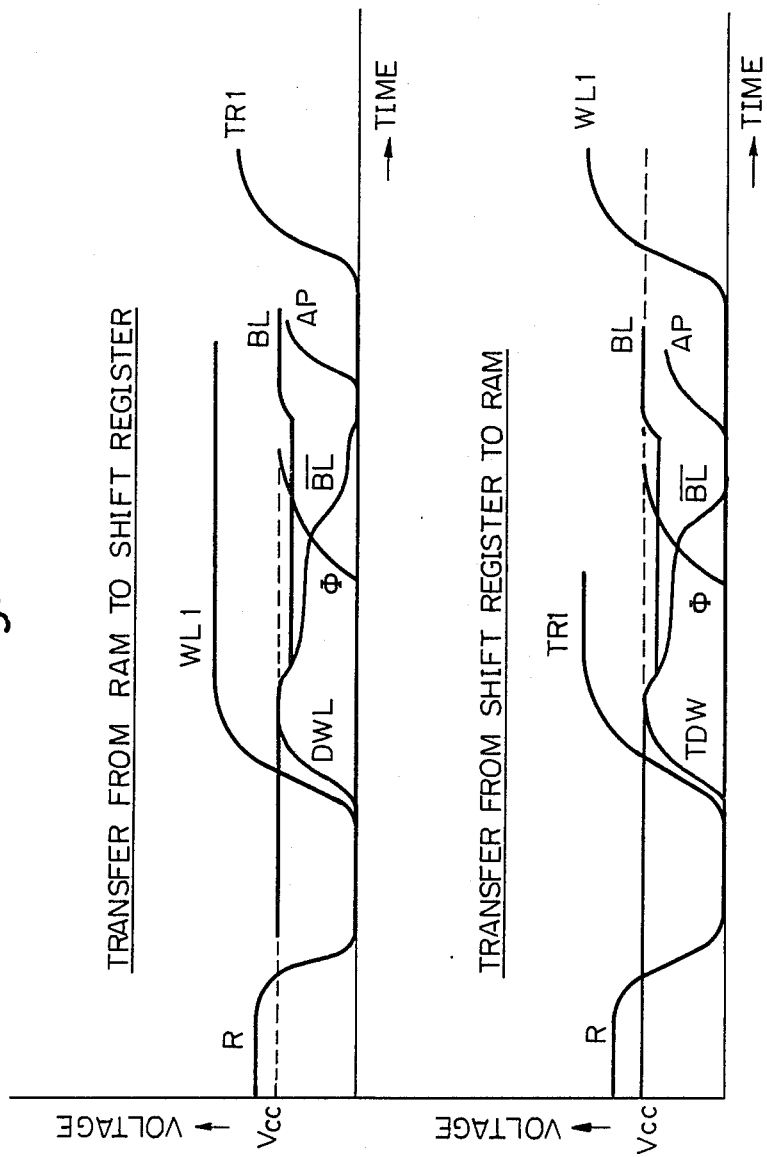
FIG. 9 shows waveforms for explaining (a) transfer from a RAM to a shift register and (b) transfer from a shift register to a RAM.

FIG. 9 is a view of the operation of a RAM. In the figure, in the write-in operation of a dynamic RAM, a reset signal R carries out precharging of bit lines (BL and $\overline{BL}$). For an address, the potentials of BL, $\overline{BL}$, AP (an active pull-up circuit), $\phi$, DWL, TR1, WL1, and TDW are shown. The upper portion and lower portion express the transfer from a RAM to a shift register and the transfer from a shift register to a RAM.

I claim:

1. A semiconductor memory device, comprising:
   a random access memory portion including a plurality of first and second columns;
   first and second shift registers, operatively connected to said random access memory portion, for serially inputting into or outputting from said device and enabling parallel transfer, of a one word line amount of data of said random access memory portion, each shift register being devided into a plurality of shift register stages;

first and second transfer gate portions, operatively connected between said random access memory portion and said shift registers, for carrying out parallel transfer therebetween, each of said first and second transfer gate portions including a plurality of groups of direct and shift transfer gates, said shift register stages of said first shift register being connected to said first columns by said direct transfer gates, respectively, and to said second columns via said shift transfer gates, respectively said shift register stages of said second shift register being connected to said second columns by said direct transfer gates, respectively, and to said first columns by said shift transfer gates.

2. A memory device as recited in claim 1, wherein said direct transfer gates comprise transistors connected between stages of said shift register and said columns, and said shift transfer gates comprise transistors connected between the stages of said shift register and said columns.

* * * * *

UNITED STATES PATENT AND TRADEMARK OFFICE
CERTIFICATE OF CORRECTION

PATENT NO. : 4,773,045
DATED : September 20, 1988
INVENTOR(S) : Junji Ogawa

It is certified that error appears in the above-identified patent and that said Letters Patent is hereby corrected as shown below:

Col. 3, line 3, "$\overline{BL-1}$, BL-1" s/b --BL-1, $\overline{BL-1}$--.

Col. 4, line 28, after "expressed" insert --generally--.

Col. 6, line 1, "BL-2" s/b --$\overline{BL-2}$--;

line 3, "$\overline{BL-2}$" s/b --BL-2--.

line 67, "devided" s/b --divided--.

Signed and Sealed this

Sixth Day of June, 1989

Attest:

DONALD J. QUIGG

Attesting Officer      Commissioner of Patents and Trademarks